United States Patent [19]

Rose

[11] 4,280,195
[45] * Jul. 21, 1981

[54] PLANAR AND NEAR PLANAR MAGNETIC BUBBLE CIRCUITS

[75] Inventor: Donald K. Rose, Palo Alto, Calif.

[73] Assignee: Hewlett-Packard Company, Palo Alto, Calif.

[*] Notice: The portion of the term of this patent subsequent to Dec. 11, 1996, has been disclaimed.

[21] Appl. No.: 47,664

[22] Filed: Jun. 11, 1979

Related U.S. Application Data

[63] Continuation of Ser. No. 695,609, Jun. 14, 1976, Pat. No. 4,178,635.

[51] Int. Cl.³ .............................................. G11C 19/08
[52] U.S. Cl. ........................................ 365/39; 365/19; 427/127
[58] Field of Search .................... 365/19, 39; 427/130, 427/131, 132, 127; 428/538, 539, 900

[56] References Cited

U.S. PATENT DOCUMENTS

| 3,699,552 | 10/1972 | Defabritis et al. | 365/2 |
| 3,714,633 | 1/1973 | Epstein et al. | 365/33 |
| 3,864,671 | 2/1975 | Myer | 365/33 |
| 3,932,827 | 1/1976 | Buhrer | 365/2 |

OTHER PUBLICATIONS

"Fabrication of Large Bubble Circuits", Reekstin et al. IEEE Transactions on Magnetics, vol. Mag. 9, No. 3, Sept., 1973.

Primary Examiner—James W. Moffitt
Attorney, Agent, or Firm—Ronald E. Grubman

[57] ABSTRACT

A magnetic bubble circuit and process for the manufacture of same is disclosed in which a pattern of permalloy elements is overlaid on a substantially planar surface contiguous with the top surface of an underlying pattern of conducting elements. This structure is fabricated by including a metal or metal alloy film on the substrate and selectively anodizing the film to produce conducting and nonconducting regions having coplanar surfaces.

6 Claims, 10 Drawing Figures

PLANAR AND NEAR PLANAR MAGNETIC BUBBLE CIRCUITS

This is a continuation of application Ser. No. 695,609 filed June 14, 1976, now issued as U.S. Pat. No. 4,178,635.

BACKGROUND OF THE INVENTION

Magnetic bubble devices are presently of interest for use as computer and calculator memories. Magnetic bubble circuits include a layer of a magnetic material such as a rare earth iron garnet in which cylindrical magnetic domains of a stable diameter ("magnetic bubbles") may be maintained in the presence of a bias magnetic field. Overlaid on the garnet substrate are "tracks" of a thin film magnetic material such as permalloy which are magnetized by an inplane rotating magnetic field to provide propagation of the magnetic bubbles around the circuit. To accomplish such functions as nucleation of bubbles in the garnet, bubble replication, switching of bubbles, and bubble annihilation it is required that the magnetic bubble circuits also include electrical conducting elements which may be pulsed to generate local fields in desired regions of the circuit. Operation of some typical magnetic bubble circuits is described in U.S. Pat. No. 3,848,239 issued to Richmond B. Clover, and U.S. Pat. No. 3,953,840 issued to Leonard S. Cutler and Richard A. Baugh, both assigned to the present assignee.

Conventional construction of these devices involves the overlay of a raised pattern of electrical conductors on the substrate, overlaid again by a pattern of permalloy elements. This results in a step-like deformity of the permalloy elements where the element crosses a raised conductor. Difficulties ensuing from the step deformation include non-uniform permalloy deposition and the occurrence of anomalous magnetic effects near the steps. These tend to decrease the effective operating margins (i.e. range of values of bias field and rotating field over which the device will operate) of the bubble circuit.

In prior art devices these difficulties associated with steps in the permalloy have been maintained at a tolerable level by limiting the conductor thicknesses to about 4000–5000 Å. However, this in turn implies that the conductors have a relatively high resistance resulting in local heating and increasing the voltage required to drive the conducting elements. Furthermore, it is known that bonding of external wires to conductors of less than about 7500 Å thickness is a difficult procedure.

SUMMARY OF THE INVENTION

In accordance with the illustrated preferred embodiments, the present invention provides a magnetic bubble circuit and process for its manufacture in which the pattern of permalloy elements is overlaid on a substantially planar surface contiguous with the top surface of the conducting layer. This structure is fabricated by initially including a thick metallic alloy film on the substrate and subsequently anodizing the alloy film in those regions where no conducting elements are desired. The anodized region forms an insulating spacer layer whose surface can readily be made coplanar with that of the conducting elements.

Anodization techniques have been employed to produce multi-layer metallizations of semiconductor devices. An extensive discussion may be found in the article entitled "An Anodic Process for Forming Planar Interconnection Metallization for Multilevel LSI", by G. C. Schwartz and V. Platter, J. Electrochem. Soc., November 1975. However, such techniques have not been applied heretofore to the manufacture of magnetic bubble circuits, so that the numerous advantages to be had from the use of the invention disclosed herein have not been available in this field.

For example, a device configured as described above includes electrical conducting elements which may be several times thicker than those known in the prior art, without entailing "steps" in the permalloy elements. Local heating by resistive losses are thereby reduced. Furthermore driving voltages to the conductor elements may be substantially reduced below those necessary in the prior art. Failure rates due to electromigration in the conductor are reduced, and bonding to the thicker metallization is facilitated. Furthermore, the permalloy elements themselves are more reliably formed in the absence of a step, producing wider operating margins for the bubble circuit.

It has also been discovered that the propagation of magnetic bubbles in the vicinity of the conductor edges is improved over the prior art. In conventional bubble circuits the magnetic bubbles require significantly more driving force to cross under a region in which there is a conducting element, than is required in devices constructed according to the present invention. The improvement is believed to be attributable at least in part to a reduction in local strain induced in the garnet substrate by the overlay of the conducting elements.

DESCRIPTION OF THE PREFERRED EMBODIMENTS

Figure 1:
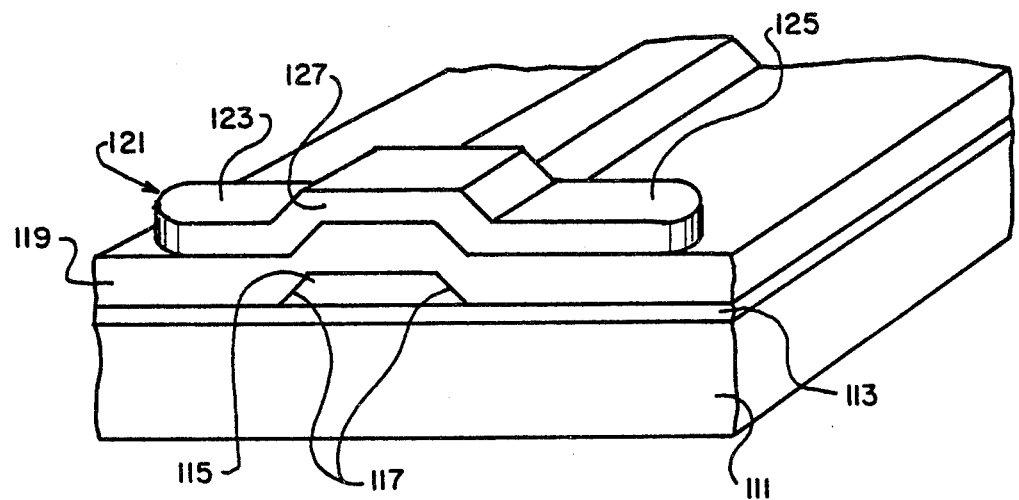
FIG. 1 illustrates a portion of a magnetic bubble circuit as known in the prior art in which permalloy elements include a step-like structure where they cross an underlying conducting element.

In FIG. 1 there is illustrated in partial cross section a portion of a magnetic bubble circuit constructed in accordance with the techniques of the prior art. A layer 111 of a magnetic material such as a rare earth garnet capable of supporting cylindrical magnetic domains in the presence of a bias magnetic field is covered by an insulating layer 113 (typically of $SiO_2$). Positioned on insulating layer 113 is a conducting element 115 illustrative of a network of such elements extending over the bubble circuit. Conductor 115 is fabricated from a metal such as gold or in some cases from a metallic alloy such as aluminum-copper. In the prior art the height of the conducting elements would typically be limited to about 2500 A to minimize the step which must be covered with permalloy. However, bonding of external leads to such thin conductors is extremely difficult necessitating an extra masking level in the fabrication to increase the thickness of bonding pads. A partial solution to this problem is illustrated in FIG. 1 in which conductor 115 includes tapered side walls 117. This is typically accomplished by acid etching the metallic conductor, and enables the use of conductors of thickness in the range 4000–5000 A without any substantial loss in operating margin due to the resulting step in the overlaying permalloy element. Again, however, bonding to a pad of order 5000 A thick is not reliable, and the etching process must be very carefully controlled to produce good bubble circuits.

To complete the prior art magnetic bubble chip, another insulating layer 119, typically of sputtered $SiO_2$ is overlaid on the conductors. This layer electrically isolates the conductors from the permalloy elements making up the bubble circuitry, and provides optimum separation of the permalloy elements from substrate 11. A typical permalloy element of a simple bar shape is labeled 121 in FIG. 1. It may be seen in the figure that element 121 includes portions 123 and 125 which are at a certain height above substrate 111 determined by the spacing of the insulating layers. However, element 119 also includes a portion 125 which is raised above the aforementioned level by virtue of its crossing a region including conductor 115. Thus, element 119 includes a "step-up" between portions 123 and 127 and a "step-down" between portions 125 and 127. The step height is typically of order 4000 A and tends to degrade the uniformity of the metallic coverage in the vicinity of the steps.

Figure 2:
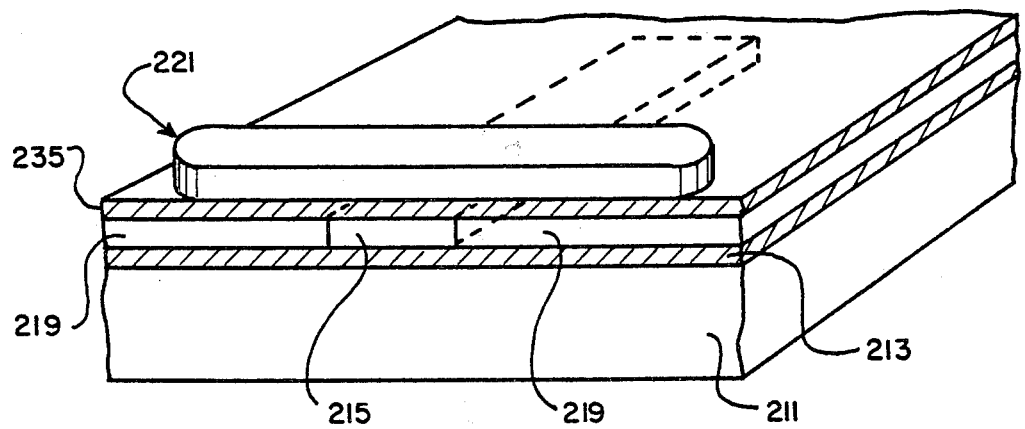
FIG. 2 illustrates a portion of a magnetic bubble circuit according to the invention in which the permalloy element is positioned on a planar surface overlying the conducting elements and an insulating region over the remainder of the underlying substrate.

In FIG. 2 there is shown in partial cross section a portion of a magnetic bubble circuit constructed in accordance with the principles of the present invention. Corresponding regions are labeled as in FIG. 1, but prefixed with a "2". Thus a magnetic layer 211, which may be epitaxially grown on a substrate, is shown overlaid by an insulating layer 213 (e.g. sputtered $SiO_2$). It is also possible to construct devices without this insulating spacer layer, but in preferred embodiments it is used to provide a surface on which subsequent layers will adhere well. A conducting strip 215 is positioned on insulator 213 and is surrounded by an insulating region 219. The figure illustrates that the height of conductor 215 is the same as the height of the surrounding insulating region 219 so that the top surfaces of the conducting and insulating regions are coplanar. Thus a permalloy strip 221 crossing conductor 215 does not have the characteristic step configuration illustrated in FIG. 1. An additional planar insulating layer 235, e.g. of $SiO_2$ may be positioned between conductor 215 and the permalloy elements to insure that the permalloy strips do not provide electrical short-circuits between the underlying electrical conductors.

Figure 3A:
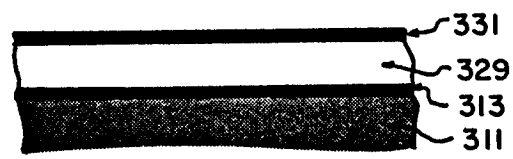
FIG. 3 schematically illustrates a cross-section of a portion of the magnetic bubble circuit during various steps in the fabrication according to the invention.

A preferred fabrication process to produce the structure of FIG. 2 is shown in FIGS. 3a–3f. In FIG. 3a a thin insulating spacer layer 313 has been deposited onto the magnetic bubble supporting material 311. For example $SiO_2$ may be sputtered onto the wafer. In practical devices the thickness of magnetic layer 311 is typically in the range 2.0–6.0 μm, while the thickness of the underlying substrate, a non-magnetic garnet, is 0.010″–0.020″. Spacer layer 313 is about 0.10 μm thick.

A layer 329 of suitable metallic composition for subsequent anodization is overlaid on spacer layer 313. In preferred embodiments layer 329 comprises an aluminum-copper alloy (for example, 4% copper) whose thickness will determine the ultimate thickness of the conducting elements of the circuit. FIG. 3a also shows another dielectric layer 331 which will act as an anodizing mask. Preferred materials for the mask are $Si_3N_4$ and $SiO_2$.

Figure 3B:
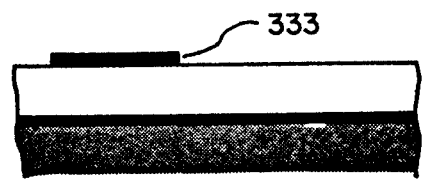
Figure 3C:
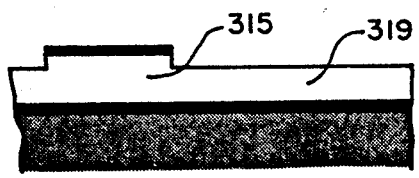
Figure 3D:
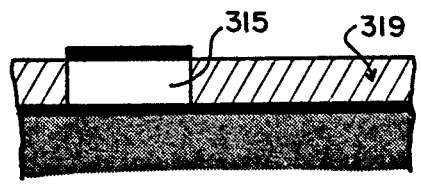
Figure 3E:
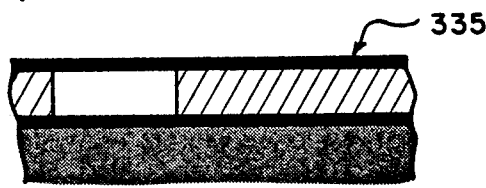

In FIG. 3b portions of anodizing mask 331 have been selectively etched away. Any of a number of techniques well-known in the art may be used; for example, a photoresist pattern for the desired final conductor configuration may be overlaid on the surface of oxidizing mask 331 followed by selective plasma etching or sputter etching of the mask. In FIG. 3b (after selective etching) a portion 333 of mask 331 remains, defining a region in which it is desired to have a conducting element in the final device; in subsequent processing steps layer 329 will be selectively anodized so that an insulating region is formed in all areas not overlaid by anodizing mask portions such as portion 333. In the course of the anodization process to follow, the resulting oxide in the unmasked regions will expand to a thickness greater than that of the original alloy layer 329. To achieve an ultimate planar configuration it is therefore necessary to remove a portion of the layer 329 sometime during the processing before anodization is complete. Thus, in FIG. 3c region 319 which is to be subjected to complete anodization is shown as being reduced in height below region 315 which will constitute the conducting element in the final configuration. This height reduction may be simply accomplished by sputtering away a suitable thickness of layer 329 during the course of forming selective mask areas 333. With the aluminum-4% copper alloy composition mentioned above removal of about 30% of the initial height is required. Another approach which produces good results is to partially anodize layer 329 and then selectively etch the partially anodized regions to reduce their height before completing the anodization. This has been accomplished using a 2% oxalic acid bath at 25° C. with a current density of 1 ma/cm to anodize the aluminum-copper alloy, which is then selectively etched by an etchant consisting of 1 liter $H_2O$ including 35 ml solution, 85% phosphoric acid and 20 grams chromic acid at 85° C. Following this etch the remaining exposed regions 319 of layer 329 are further anodized, for example, using 2% oxalic acid at 25° C., and limiting current density to 5 ma/cm² and voltage to 50 V, to produce the configuration of FIG. 3d in which the surface of region 319 is coplanar with the surface of region 315. Mask regions 332 are then removed by conventional etching procedures and a thin spacer 335 for example, of $SiO_2$ is sputtered uniformaly onto the wafer, as shown in FIG. 3e.

Figure 3F:
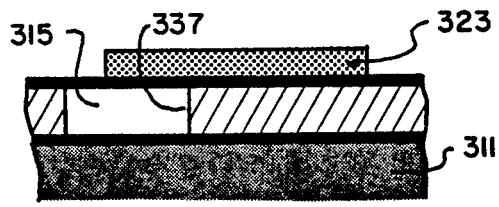

Following this step a layer of magnetic material such as permalloy, thickness about 0.40 μm, is sputtered onto the wafer and masked to define a desired magnetic bubble circuit pattern. In FIG. 3f a permalloy bar element 323 is shown resulting from the last-mentioned masking and etching step. FIG. 3f is equivalent to FIG. 2 and again illustrates that in a magnetic bubble circuit constructed according to the above-described process the magnetic circuit elements such as 323 may be overlaid on conductor regions such as 315 without necessitating any step-like configurations in the magnetic elements, such as was the case in the prior art. It is evident from this description that deviations from co-planar may occur under some conditions. However, deviations up to about 5-10% of the thickness of the conductors do not measurably decrease performance.

Figure 4:
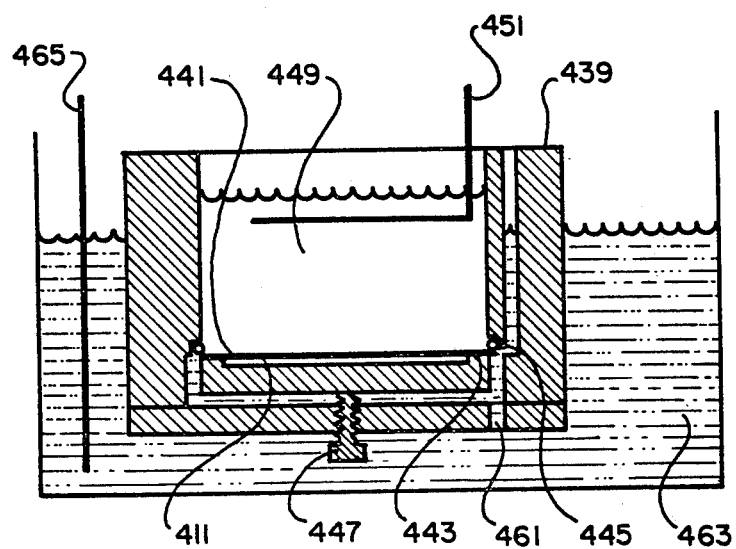
FIG. 4 illustrates in cross-section a jig and accompanying structure in which magnetic bubble circuit may be prepared according to the method of the present invention.

In FIG. 4 there is illustrated a jig 439 suitable for anodizing metal layer 329 (FIG. 3) on the insulating substrate 411. In prior art anodization techniques utilized in semiconductor fabrication, the substrate of the semiconductor chips was typically of a conducting material such as doped silicon. Electrical contact to the surface to be anodized was therefore achieved through the substrate. However, in the present device, substrate 411 is non-conducting. Jig 439 is therefore designed to bring in the required anodizing current laterally; i.e., from the outer edge of the wafer to be anodized. More particularly, a wafer 441 containing a number of magnetic bubble circuits to be anodized is positioned between a holding surface 443 and an electrically insulating O-ring 445. For example a set screw 447 can be used to maintain positive contact between wafer 441 and O-ring 445. An anodizing solution 449 (such as the particular solution described above in connection with FIG. 3) is held in a cavity of jig 439 and makes contact with the surface of wafer 441 to be anodized. An electrical contact 451 (e.g., of stainless steel or aluminum) is inserted into anodizing solution 449, to act as an anodizing cathode.

Figure 5:
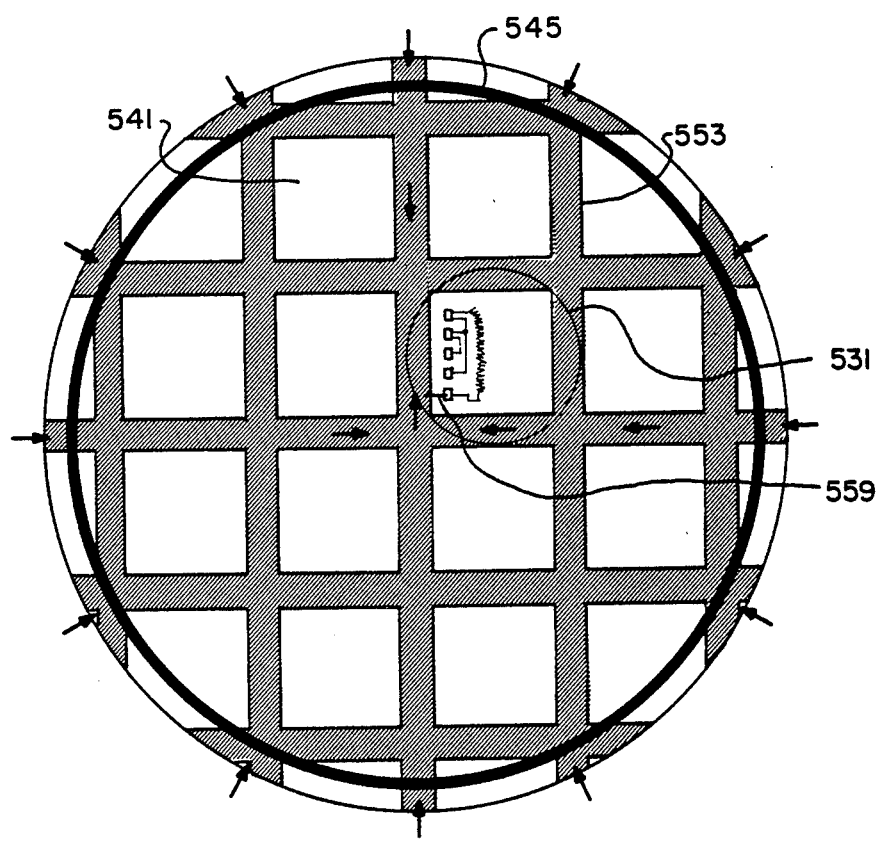
FIG. 5 shows a top view of a wafer on which magnetic bubble circuits are to be fabricated in the apparatus of FIG. 4.

Electrical contact to the wafer is made through a conducting solution 463 onto the small region of wafer 441 which extends outside the insulating O-ring. In FIG. 5, a number of arrows indicates the path of current flow through scribe lines 553. Also shown in FIG. 5 is a portion of the anodizing mask 531 which includes sections defining the underlying conductor metallization pattern. An additional interconnect portion 559 defines a short interconnect between scribe lines 553 and the conductor metallization pattern. Current is therefore transmitted from O-ring 545 through scribe lines 553 into the layer to be anodized along those regions which will constitute the final conducting elements.

Referring again to FIG. 4, positive electrical contact with wafer surface 441 is provided by including a channel 461 in contact with the outer edge of the wafer surface 441 and also in communication with a conducting solution 463 outside the jig. An electrical contact 465 completes the electrical circuit. Conducting solution 463 may include the same constituents as anodizing solution 449. Thus current is continuously transmitted through scribe lines 553 into region 429 to be anodized through paths defining conducting elements 315 (FIG. 3) until anodization of the unmasked areas 319 (FIG. 3) is complete.

Many advantages flow from the planar configuration of magnetic circuit elements 323 and from the greatly increased thickness of conducting regions 315 which may be obtained thereby. More uniform coverage of the magnetic material constituting elements 323 may be obtained then in the case where the elements must step over a raised conductor. Spurious magnetic effects occurring at the step are eliminated so that operating margins may be increased. Resistive heating in the conductors is reduced due to their greater thickness, and concomitantly smaller driving voltages are required to provide desired currents through the conductor elements. Electromigration in the conductor is reduced, and bonding of external leads to the thicker conductor is greatly facilitated over the conductor thicknesses available in the prior art. Yet another interesting result which has been discovered in devices configured in accordance with the invention is that magnetic bubbles in region 311 propagate uniformly throughout the substrate even when passing under regions corresponding to conductor boundaries (such as boundary 337). In prior art devices bubble position would lag behind the associated phase of the drive field when bubbles passed through these regions. This effect is believed to be attributable at least in part to strains induced in the supporting substrate 311 by deposition of conductor 315. In devices constructed according to the present invention in which a metal alloy layer 329 is deposited over the entire substrate and then selectively anodized, the phase lag has been found to be significantly decreased, and the magnitude of the minimum drive field required to drive bubbles under the conductor elements has been reduced.

I claim:

1. A magnetic bubble device comprising:
a substrate of magnetic material capable of sustaining magnetic bubble domains in the presence of a bias magnetic field;
a nominally electrically conducting layer on the substrate having regions of an electrically conducting material contiguous with insulating regions of the anodic oxide of said conducting material, said insulating regions having been formed by selective anodization of said nominally electrically conducting layer, so that said electrically conducting regions and said insulating regions have substantially co-planar top surfaces; and
magnetic bubble propagating means on said layer of electrically conducting and insulating regions.

2. A magnetic bubble device as in claim 1 further comprising:
an electrical insulating spacer layer between said substrate and said layer of electrical conducting and insulating regions.

3. A magnetic bubble device as in claim 2 further comprising:
an additional electrical insulating layer between said layer of electrically conducting and insulating regions and said magnetic bubble propagating means.

4. A magnetic bubble device as in claim 3 in which said layer includes electrically conducting regions of aluminum-copper alloy and insulating regions of an anodic aluminim oxide formed by selective anodization of said layer.

5. A magnetic bubble device as in claim 1 further comprising:
an additional electrical insulating layer between said layer of electrically conducting and insulating regions and said magnetic bubble propagating means.

6. A magnetic bubble device as in claim 1 in which said layer includes electrically conducting regions of aluminum-copper alloy and insulating regions of an anodic aluminum oxide formed by selective anodization of said layer.

* * * * *